United States Patent [19]

Stoner et al.

[11] Patent Number: 4,768,195

[45] Date of Patent: Aug. 30, 1988

[54] CHIP TESTER

[76] Inventors: Donald W. Stoner, 6028 Harvey Way, Lakewood, Calif. 90713; Lawrence S. Canino, 4815 Milne Dr., Torrance, Calif. 90505

[21] Appl. No.: 91,062

[22] Filed: Oct. 9, 1987

Related U.S. Application Data

[63] Continuation of Ser. No. 751,567, Jul. 3, 1985, abandoned.

[51] Int. Cl.[4] .............................................. G01R 31/26
[52] U.S. Cl. .................................. 371/25; 324/73 AT
[58] Field of Search ........................ 324/73 R, 73 AT; 371/20, 25

[56] References Cited

U.S. PATENT DOCUMENTS

| | | | |
|---|---|---|---|
| 3,735,255 | 5/1973 | Goldman | 324/73 R |
| 4,180,203 | 12/1979 | Masters | 324/73 R X |
| 4,291,404 | 9/1981 | Steiner | 324/73 AT X |
| 4,380,070 | 4/1983 | Steiner | 324/73 R X |
| 4,502,127 | 2/1985 | Garcia | 371/25 X |
| 4,507,576 | 3/1985 | McCraken | 324/73 R X |
| 4,539,517 | 9/1985 | Flora | 324/73 R |
| 4,544,882 | 10/1985 | Flora | 324/73 R |

Primary Examiner—Jerry Smith
Assistant Examiner—Stephen M. Baker
Attorney, Agent, or Firm—Don A. Hollingsworth

[57] ABSTRACT

A chip tester for testing microelectronic circuit chips. The tester is capable of testing a variety of chip types in a single socket, including chips having different circuit functions, different pin configurations, and different number of pins. Tests are performed without any preliminary tester setup steps other than placing the chip to be tested into the test socket. The tester applies input voltages and output loads and monitors input and output signals for a first possible chip type, and upon failing to meet expected input/output measurement conditions, applies input voltages and output loads and monitors input and output signals for a second possible chip type. The process is repeated and continues until the monitored inputs/outputs for the chip under test meet the expected input/output measurement conditions, at which time a display device indicates that the chip under test is operational and, preferably, displays the chip type. The tester then repeatedly applies the test procedure only for the chip type being tested, the latter test procedure repeating indefinitely. The inputs and outputs continue to be monitored, and should an error appear in the measurements during any of the repeated tests, a count is made of the number of errors detected, and the count of the number of errors is displayed.

3 Claims, 6 Drawing Sheets

CHIP TESTER
BLOCK DIAGRAM

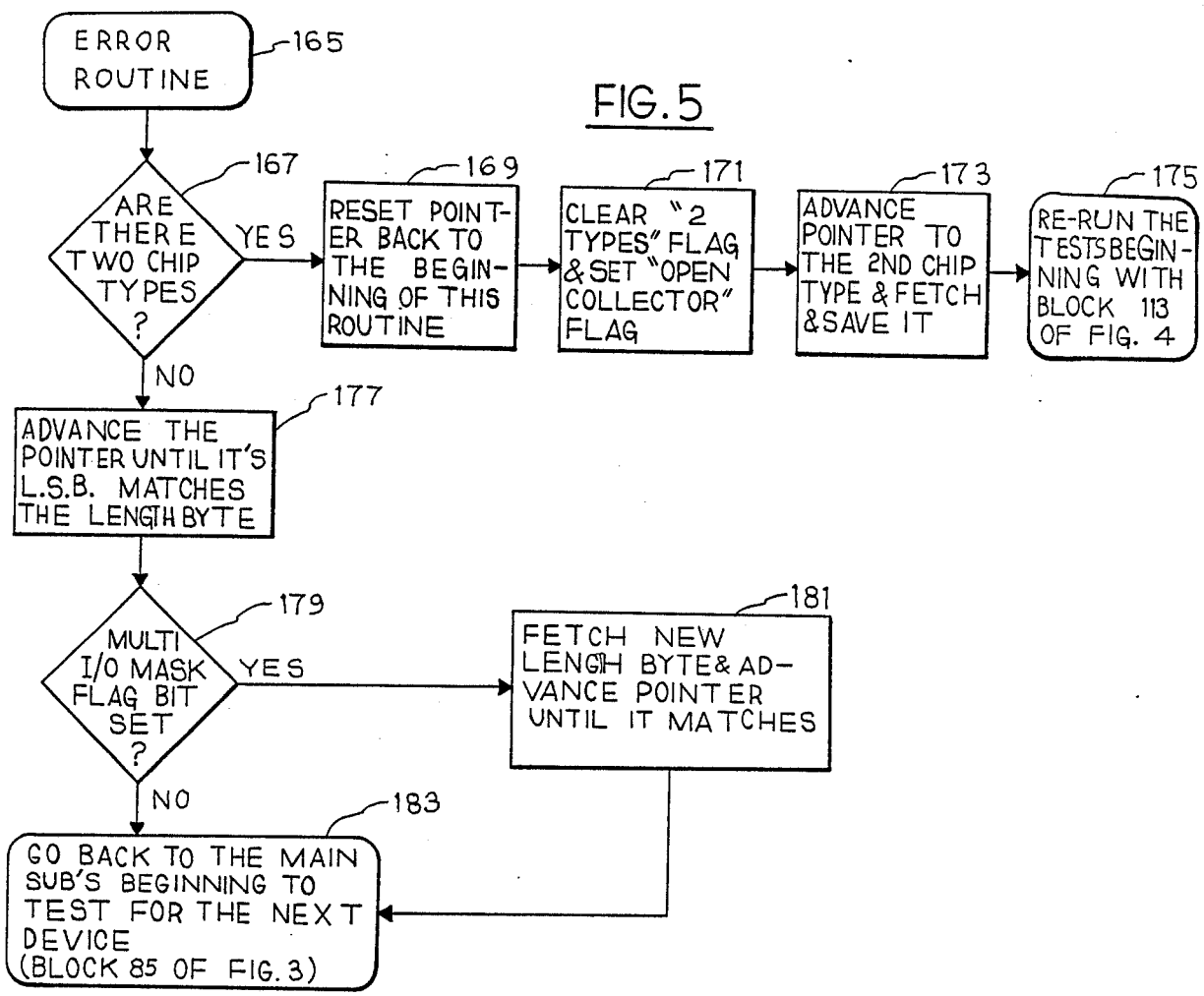
FIG. 5
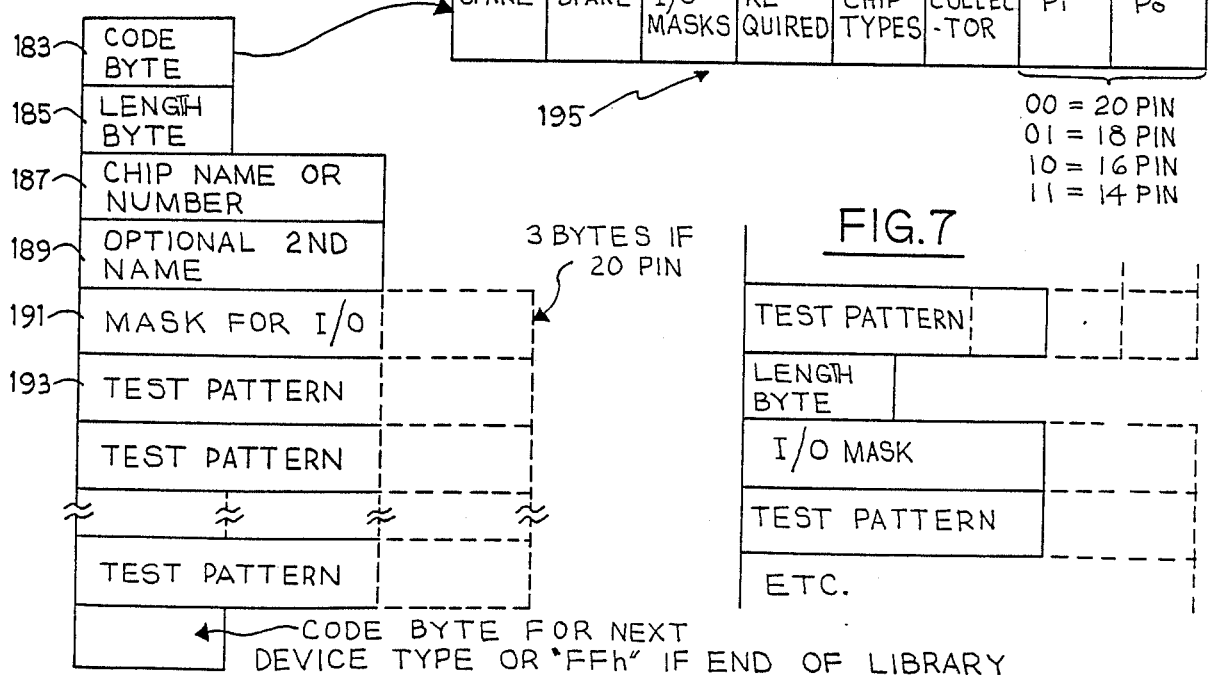
FIG. 6
FIG. 7

CHIP TESTER

This is a continuation of application Ser. No. 751,567, filed July 3, 1985, abandoned.

BACKGROUND OF THE INVENTION

1. Field of the Invention

This invention relates to a tester for testing microelectronic circuit chips. More specifically, the invention concerns the application of input signals to, and measuring output signals from, a chip under test, and displaying the results of such a test.

2. Brief Description of the Prior Art

Chip testers have been known in the art for more than a decade. Microelectronic chip manufacturers have used sophisticated and complex chip testers in the research and development of new chip types. These testers can check the chip on the master wafer even before individual chips are separated therefrom. A multi-fingered contact assembly may even automatically step and repeat a series of tests on each of a plurality of chips of the master wafer slice.

After scribing and chip separation from the master wafer, the chips are mounted in a multi-pin case and connected to pin terminals by thin wires. After such assembly, the chip may again be tested by contacting the pins of casing and applying input voltages while monitoring output voltages. Again, a series of tests may be applied in order to exercise all possible functions and input conditions.

In the latter type of tester, a more simplified tester is used, but both types of testers described may cost in the tens of thousands of dollars.

Laboratory bench testers are also available for performing measurement testing of microelectronic chips in a laboratory or on the work bench. Such testers will typically have a number of different sockets for accommodating chips having a different number of pins, as well as a number of switches for preliminarily setting up input voltages and output measurements based upon the knowledge of the pin configuration for a particular chip device type. A technician, for example, would look up the device type in a long list of microelectronic chip types, and upon finding the desired chip type in the listing, be given instructions for setting the switches on the tester to predetermined positions so that the inputs of the device under test will have proper levels of voltage and current and so that the output measurement instruments will selectively measure corresponding voltages and/or currents on the output terminals, again for that particular type.

In all of the aforementioned chip testers, the chip type must be known before the testing commences, and the socket for the chip (or the finger probes) must be assigned specific voltages and/or currents for application to the predetermined input pins of the device under test. The output terminals of the device under test must be predetermined so that the measurement of the voltages and/or currents at the output terminals can be compared against prescribed standards. In all cases, the exact position of all input pins, power supply pins, and output pins (or contact pads) for the chip under test are known. If a different chip is to be tested, especially if the second chip has a different pin configuration for input, power, and output terminals, and/or has a different number of pins on the case of the device, the second chip to be tested must be inserted in different socket, and before insertion, the selectable switching arrangement must be manually or automatically rearranged so as to apply input voltages/currents to input terminals, proper power supply voltages to power terminals, and output measurement instruments to output terminals.

For the technician in the laboratory or the work bench of a service department, the testing of a chip can be an extremely time consuming effort. First, it is necessary to identify the nomenclature on the casing to determine the chip type. This is sometimes difficult, especially to a novice, since microelectronic chips are typically encoded with date codes, manufacturer part numbers, patent numbers, and the like, as well as the actual part number to identify the function of the device.

After the technician has determined the correct chip type, he or she locates that chip type in a list of hundreds of chip types and methodically sets a number of switches to the prescribed settings in the listing in order that the chip to be tested will have proper input, power, and output terminal connections. The technician then locates in the listing the proper socket to plug the chip into, and only after such a procedure the chip under test can be evaluated.

It is clear that there is a need in the art for a simplified chip tester that will eliminate or minimize the efforts involved in identifying the chip type, that will automatically insure proper pin contacts for input, power, and output lead connections, and that will perform a repetitive test over a long period of time on the chips for the detection of intermittent malfunctions. The present invention fills this need.

BRIEF DESCRIPTION OF THE INVENTION

The present invention overcomes the difficult and complex procedures in connection with the several device testing apparatuses described above. In addition to simplifying the testing procedure for microelectronic chip testing, several heretofore unknown improvements are implemented.

According to the invention, the tester comprises a socket for releasably receiving and making electrical contact with the terminals of one of a number of different types of chips to be tested, circuit means for performing the necessary tests for any of said number of different types of chips to be tested, and an output device for indicating certain characteristics of the unit under test.

The electronics of the chip tester includes circuitry for providing appropriate power and prescribed electrical signals in a routine comprised of the application of a serial sequence of input/output patterns, a different input/output pattern sequence being supplied for each different type of chip that the tester is capable of testing. When every input/output pattern in a particular sequence (out of a library of different sequences for different chips) corresponds to the required pattern in a sequence of input/output patterns expected for an operational chip under test, then the output device indicates that the device under test is operational.

In addition, the electronics of the chip tester includes circuitry for systematically trying each of the different sequences in the library on the device under test to see if any of the sequences matches an operational device as described above.

Innovative functions not heretofore known in the art include apparatus for indicating the chip type responsive to the existence of a predetermined relationship between the signal pattern on the input terminals and the signal pattern monitored on the output terminals of the device under test. That is, with the present invention, a chip to be tested may be inserted into the test socket for evaluation without any prior knowledge of the chip type. By applying a series of input/output test pattern sequences to the device under test, upon finding a pattern sequence that produces expected output measurement results responsive to a corresponding set of input terminal signals, the tester indicates that the chip under test is operational and, since the input/output relationship of each chip type is unique, the tester outputs (preferably by visual display) a representation of the chip identification number which corresponds to the valid input/output pattern relationship. This identification number could be a recognizable abbreviation of the full device identification number. For example, the 7400, the 74C00, the 74L00, the 74H00, the 74S00, and the 74LS00, and the corresponding 5400 devices, are all functionally identical with the exception of their reliability, temperature, speed, and power characteristics. Generally, a technician is well aware of the family type of chip he or she is working with, and the identification of the chip as "00" without the rest of the designation for the chip is all that is necessary. As a result, the aforementioned twelve types are commonly abbreviated "00" by the tester. Furthermore, a low-cost embodiment of the present invention might not be equipped to distinguish between the various types, and thus the abbreviated part number would be a more correct reporting of the device type. It is to be understood that the term "identification numbers" (sometimes referred to herein as "names" or "types") is intended to include but not be limited to such abbreviations.

By another innovative testing procedure, 14-pin, 16-pin, 18-pin, and 20-pin chips can all be tested in the same socket. Accordingly, the chip tester is provided with, again preferably, a 20-pin socket of the type having an engagement/release mechanism for permitting the chip under test to be inserted in the socket with zero insertion pressure.

TTL devices commonly have the VCC power (+5 volts) applied to whichever pin is identified with the highest pin identification number. This pin is at one corner of the device near the device's orientation mark. Most TTL devices having 14, 16, 18, or 20 pins can all be inserted into a 20 pin receptor with the VCC pin corresponding to the receptor's pin number 20. This pin need only be connected to the +5 volt power source to accommodate these TTL devices. Connection of the ground pin of the devices is slightly more complicated, however. A 14, 16, 18, or 20 pin chip will most often have its ground pin aligned with pin 7, 8, 9, or 10, respectively, of the same 20 pin receptor. The receptor's pin number 10 may always be grounded, as this will not affect pins on 14, 16, or 18 pin devices. However, some switching is required for power grounding pins 7, 8, and 9.

To make this switching transparent to the user, the present invention makes the selection as follows: as described above, the circuitry systematically tries a series of sequences of patterns against the device under test. Each sequence of patterns corresponds to a device with a known ground pin number. While each sequence of patterns is being run, the circuitry enables whichever ground pin would be correct for the particular device which corresponds to the sequence of patterns. This means that until the device under test has been identified, it is repeatedly subjected to incorrect ground connections. In practice, this is not a problem, because the tester identifies the device under test and consequently identifies the correct ground pin very quickly before the device has a chance to become damaged.

It can be readily seen to one skilled in the art that the above described method of locating the ground connection for an unidentified device under test could also be used to determine non-standard VCC connections or any combination of power connections, so long as none of the brief trial power combinations could damage any of the other devices which will sometimes be present for verification.

To further protect the device under test, the circuitry grounds all pins between the candidate ground pin and pin 10 of the receptor. This ensures that no input on a standard TTL device under test will ever be subjected to a voltage which is negative with respect to the device's ground pin. Although this means that the device's outputs might be shorted to ground, this is not problematical; manufacturers usually guarantee that at least one output can be held to ground indefinitely without damage to or malfunction of the chip. The unwanted grounding of outputs here is for such a short duration that the effect is inconsequential.

In order to provide long-term testing of the chip under test, an error counter is provided. The counter is incremented each time the output measurement tests fail to provide the predicted output signal pattern sequence. That is, once the tester has determined what chip type it is testing, it ceases to test for other chip types. Instead, it repeatedly runs only the sequence of test patterns which relate to the actual device. This technique has two advantages. First, the tester stops experimenting with the ground connections and ceases to subject output pins to unwanted grounding. Second, the chip under test can have its internal circuitry exercised repeatedly and indefinitely according to a predetermined input/output relationship. Thus, after the tester has indicated that a valid operational chip is in the socket, it will continue to repeat the input signal pattern sequence and monitor the output signal patterns indefinitely. At any time an output level is sensed which does not correspond to the input signal pattern supplied at that time, the tester will stop repeating the same sequence of test patterns and will resume searching through the library of routines of test pattern sequences. This condition means one of two events has happened; either a "glitch" has been detected in an intermittetly functional device, or the device has been removed from the receptor. If the device has been removed, the tester will continue to loop through the library until the next device is presented and a match is found. If the improper signal pattern was the result of a "glitch", the tester will make one loop through the library back to the same sequence of test patterns where it will again identify the device as corresponding to the pattern sequence (presuming that the "glitch" was of short duration). Because it is desirable to detect intermittent failures and because this single loop through the library of devices can be too quick for a person to notice, a "glitch" counter is incremented by one count for every complete loop through the library of devices which the tester makes.

A display device displays the count of the counter so that observations can be made as to the operational character of the device under test over a long term. Additionally, the technician may wish to apply heat or cold to the chip under test during this continuous testing mode, i.e. after the chip tester has determined the identity of the chip under test and has applied the repeated input/output test patterns. The "glitch" counter is essential in this type of testing, since an intermittent device may be faulty for only a few microseconds or milliseconds, and this would be unnoticed by observing a visual display which would appear to indicate that the chip under test is operational. With the aid of the "glitch" counter, the technician can leave the device unattended and when returning to the test station may observe the number of counts in the "glitch" counter which will indicate the number of times the chip has failed since the beginning of the test.

In addition to the above features, the tester can identify and distinguish between some high powered and low powered digital microelectronic chips (when they have different pinouts) and will indicate which type is being tested as a part of the visual display of the test results. The tester is capable of applying multiple input/output pin assignments for chips with complex functions. For example, on some tri-state devices such as the 74LS242, the same pin may sometimes be an input and sometimes an output. To fully test the device, both conditions must be exercised.

The tester also has the ability to automatically precondition a chip ("setup") to insure that its logical states are established according to predetermined conditions before the test patterns are applied for chips whose logic states would otherwise be unpredictable without such preconditioning. Additionally, the tester can test for the possibility of two chip types having the same pin configuration and function but with different types of output drives (such as between bidirectionally driven output drives and open collector output drives) and indicate the chip type on its output device (display).

BRIEF DESCRIPTION OF THE DRAWING

The invention will now be described in detail with reference to the accompanying drawings representing preferred embodiments of the chip tester according to the present invention. In the drawings:

FIG. 5 is a third flow chart diagramming the error routine;

FIG. 6 is a diagram of the format of the test routine for a simple chip type;

FIG. 7 is a diagram of the extended format for a test routine for a more complex chip type.

DETAILED DESCRIPTION OF THE PREFERRED EMBODIMENTS

Figure 1:
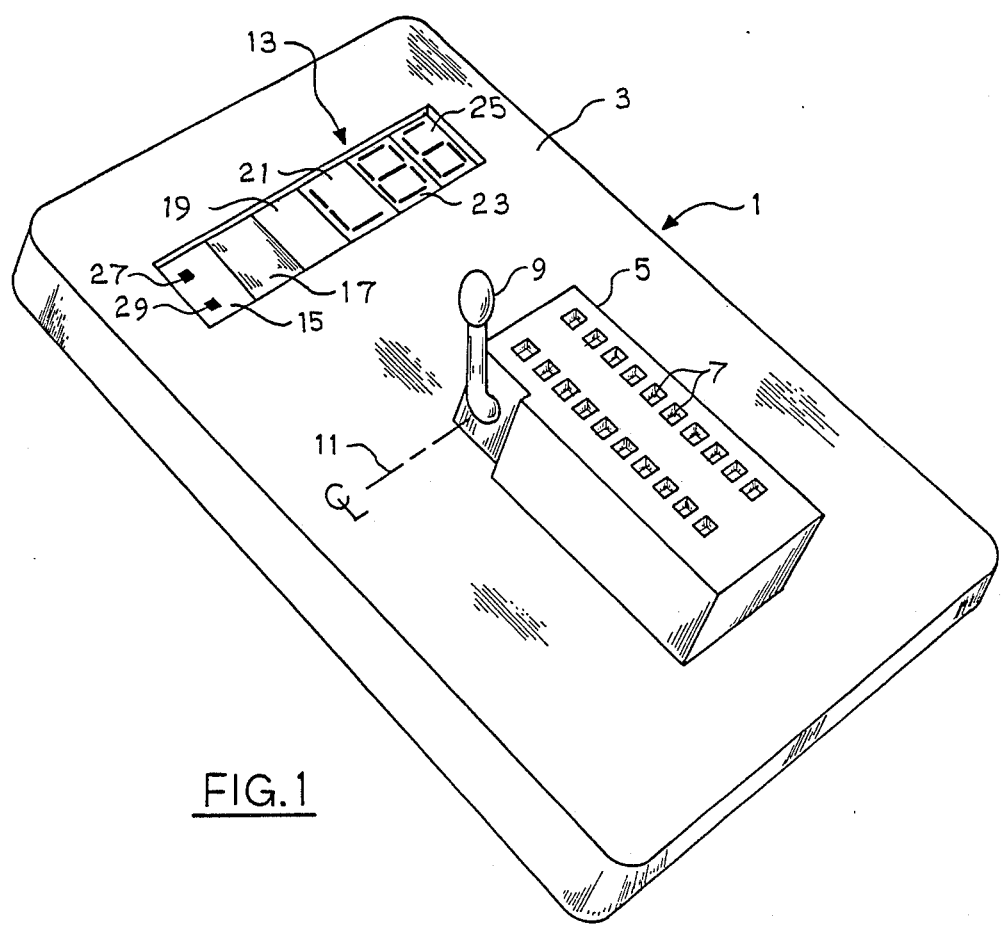
FIG. 1 is a perspective view of the chip tester showing the device socket and the display unit.

In FIG. 1, a preferred implementation of the invention is illustrated. Tester 1 is comprised of a case 3, socket 5, and display 13. It is to be understood that the display 13 is merely one of a number of possible output devices which can indicate the quality of the chip under test, the chip identification number, and the long term reliability of the chip under test. For example, it is reasonable to expect that an adequate indicating means for informing the technician of the latter-mentioned characteristics of the chip under test could comprise an audible indicator emitting sounds. Such an indicating means could be as simple as a tone of one frequency for indicating a good chip and a tone of a different frequency indicating a bad chip. Although tones could also be used to indicate long term stability and reliability of the chip under test, as well as the chip identification type, it is within the scope of the present invention to incorporate a speech synthesizer which is preprogrammed to audibly utter the same information as would a visual display device depicted in the preferred embodiment of this invention. The tester could obviously be incorporated in an advanced test setup with an automatic robot parts tester and sorter, effectively giving a go/no go decision and eliminating the need for any type of display or "CHIP OPERATIONAL" indicator. In the example described herein, however, an LED display is used.

Test socket 5 is shown to have twenty pin receptacles 7 spaced according to standard 20-pin case specifications. Socket 5 is preferably of the zero-insertion force type of socket in which a handle 9 is pivoted about the axis 11 of an internal shaft (not shown) which is operative to alternately release and apply pressure contact to the pins of an inserted chip under test.

Display 13 is shown to have five active display segments 15, 19, 21, 23, and 25, although the invention is not to be limited by any number of display segments. Blank 17 is shown as a spacer to separate the "glitch" display and the "device type" display. Display segment 15 is the error count display segment which can, in a more sophisticated design, display the count of errors detected by any number of 7-segment display characters, or, in a simpler embodiment, may be as simple as the two-decimal point arrangement shown in FIG. 1. The FIG. 1 arrangement of "glitch" count display (decimal points 27 and 29) is chosen for simplicity and in the interest of keeping the cost of the tester as low as possible for making it available to a wide market of users. In the example illustrated, decimal point 29 represents the least significant digit of a binary indicator, decimal point 27 being the most significant digit indicator. Thus, if no errors are detected, both decimals 29 and 27 would be off, a single error would illuminate decimal 29, two errors would illuminate decimal 27, and three errors would be indicated by the two decimals 27 and 29 on at the same time.

The "glitch" counter is incremented once each time the tester loops through the entire library of device types, as described above. This means that as long as no device is being presented to the tester, the decimal points 27 and 29 will be blinking rapidly. As soon as an operational device is presented for verification, the tester will identify it and will therefore stop looping through the library and will subsequently stop incrementing the "glitch" counter. This counter may stop in any state and therefore display any combination of decimal points 27 and 29. As long as an operational device remains connected to the socket 5, the combination of decimal points will remain the same, thereby indicating proper operation. Should the device "glitch", then the decimal points will change their display pattern in the manner of a binary counter, showing three different states of the "glitch" counter corresponding to the first three "glitches" detected before looping back to the original pattern upon detecting the fourth "glitch".

Figure 2:
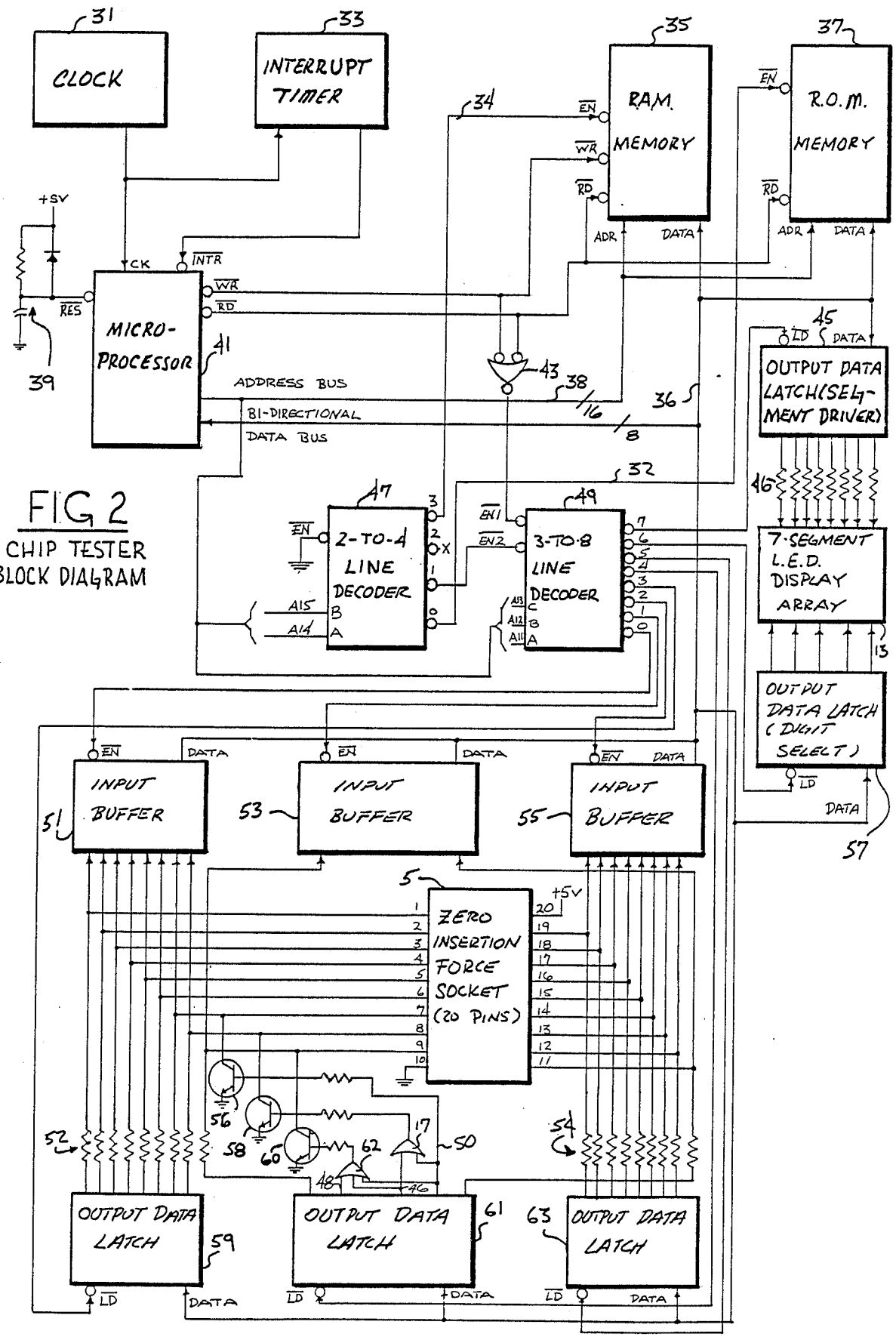
FIG. 2 is a general block diagram of the chip tester.

FIG. 2 is the basic block diagram for the circuitry of the chip tester. Many of the functional blocks illustrated in FIG. 2 can be implemented (in a best mode of operation for the invention) by utilizing the equivalent functions of a suitable microelectronic processor chip. For example, the system of FIG. 2 can incorporate the system clock 31 into the 8085 microprocessor manufactured by Intel with the additional components of one resistor and one capacitor (not shown). With some other microprocessors, however, an external clock will be required.

Interrupt timer 33 is the counter which provides an interrupt every few milliseconds to provide timing for the LED display 13. Only one of the four LED digits 19, 21, 23, 25 or any combination of the decimal points 27, 29 can be turned on at any given time. If desired, and when the expense is justified, additional electronics can be incorporated such that all of the display digits can be illuminated simultaneously. The time-sharing of the LED drive source was chosen for the preferred embodiment of this invention to make the cost more palatable for the bench technician. Because of the high frequency of the refreshment of the display, the human eye is unable to detect any blinking effects in the display, and accordingly, a substantial advantage has been obtained at no expense in function, convenience, or comfort of use. In order to implement the time-sharing of the display driver, the digits must be sequentially illuminated to give the illusion of all of the digits being simultaneously on. An interrupt routine stored in the ROM 37 handles this procedure, rotating through the five possibilities (digits 1-4 and the decimal points) every five interrupts, then repeating this sequence indefinitely. The interrupt routine fetches the data which it displays from a fixed location in the RAM 35 so that all of the complexity of maintaining the display is transparent to the main routine. Output data transfer to the display routine is accomplished by writing to the aforementioned location in RAM 35.

In this connection, an Intel 8156 combination integrated circuit, designed to be a companion to the 8085 microprocessor, may provide the interrupt timer function.

Random access memory 35 provides the requisite storage function for the microprocessor 41, i.e. the random access memory function needed for the microprocessor's subroutine stack and scratch areas. This memory function may also be a part of the 8156 combination integrated circuit.

Read only memory 37 contains the control sequences which will be described later in connection with the description of FIGS. 3, 4, and 5, as well as the library of sequences of test patterns which will also be described later with respect to FIGS. 6 and 7.

The circuit components identified by the numeral 39 comprises a standard power on reset circuit and need not be described in detail in this specification, being a circuit within the common knowledge of a worker skilled in the art.

As previously mentioned, the 8085 microprocessor 41 was considered in the implementation of the preferred embodiment of the invention, but the block diagram of FIG. 2 applies equally well to other types of microprocessor chips.

The address bus 38 and the data bus 36 are each illustrated as a single line in FIG. 2 to make it easier to follow. Actually, the address bus 38 comprises 16 separate lines, and the data bus 36 comprises 8 lines. The single line indicating the entire bus is all that is necessary, as anyone skilled in the art will understand where each individual line must be connected. The exceptions: A14 and A15 connecting to the 2- to 4-line decoder 47, and A11, A12, and A13 connecting to the 3- to 8-line decoder 49 are indicated for clarity.

The "OR" gate 43 combines the "read" and "write" control lines so that a single 3- to 8-line decoder 49 can be used for both inputs and outputs.

Output data latch 45 constitutes an 8-bit output latch for driving the LED display 13. Only seven of the output lines are used, however. These seven signals, through resistor network 46, control which of the seven segments in display 13 are turned on for whichever digit is currently being selected by the output data digit selection latch 57. If digit selection latch 57 is currently selecting the decimal points, then two lines from the segment driver latch 45 selects which of the two decimal points of segment 27 are lit. The seven resistors 46 are to limit the current so that the LED array will not be damaged, as is common knowledge in the art.

The 2-to-4 line decoder 47 takes the two most significant address lines A14 and A15 and uses them to divide the memory space into four areas. The low order output of decoder 47, corresponding to addresses 0000h to 3FFFh, is used to enable the ROM memory 37 over line 32. The next-to-low order line is assigned to I/O ports 40 to 7Fh (or 4000h to 7FFFh if memory map I/O is used). The high order output C000h to FFFFh is used to enable the RAM memory 35 over line 34.

The 3- to 8-line decoder 49 takes the I/O selection line from decoder 47, the "read or write" signal from gate 43, and address lines A11, A12, and A13, and splits the I/O address space into eight separate ports. Three of these, (0-2) are inputs, and the other five (3-7) are outputs. Because the program under which the microprocessor operates never tries to output to an "input" port, no data bus conflicts ever occur.

The seven-segment LED display 13 used in the preferred embodiment has four seven-segment digits and two decimal points.

The array used in the preferred embodiment can only have one single digit illuminated at a time. This means that the digits must be multiplexed as described earlier in connection with the description of interrupt timer 33.

Input buffer 51 is used to input signals from pins 1-8 of the device under test (loaded into socket 5) to the data bus 36. This function may also be part of the 8156 Intel combination integrated circuit previously noted.

Input buffer 53 is another input port. Input buffer 53 is not used unless the chip tester is looking for a 20-pin device in socket 5. It inputs data from pins 9 and 11 of the device under test to the data bus 36. These pins do not carry signals when 14-, 16-, or 18-pin devices are being tested. To reduce hardware, a preferred embodiment may feed one of these inputs to one of the serial inputs of an 8085 processor and the other into one of its spare interrupt lines (not shown). Although this arrangement would reduce component cost, the implementation thereof is complicated and difficult to describe. Thus, the block diagram of FIG. 2 and this description illustrate the more straightforward implementation of using a conventional input buffer 53.

Input buffer 55 is yet another input port. This input buffer services pins 12 to 19 of the device under test. Note should be made of the fact that these pin numbers correspond to the pin numbers of the 20-pin socket and not to those of a 14-, 16-, or 18-pin device. Pin 14 of a 14-pin device would align with pin 20 of the 20-pin socket when properly inserted. The preferred embodiment uses the 8156 combination integrated circuit chip for this port also.

The aforementioned digit selection output data latch 57 is used to select one of the four digits or the decimal points of the LED array 13. Only one of the digits is selected at a time as described above in connection with interrupt timer 33.

Block 5 of FIG. 2 is a zero insertion force socket with side lever 9 and is used to hold and contact the pins of the device being tested. The socket has 20-pin capability and can accommodate integrated circuits with 14, 16, 18, or 20 pins. All integrated circuits must be inserted with pin 1 of the device connected to pin 1 of the socket, or the power connections will be in the wrong position and the test will fail. Pin 20 of socket 5 is always connected to +5 volts and pin 10 is always connected to ground. Chips which require supply ground at pins other than pin 10 can be accommodated by the operation of the three transistors 56, 58 and 60. The two "OR" gates 17, 62 are to ensure that no output will be pulled lower than the potential of the ground connection. Otherwise, the device under test could possibly be damaged. In the preferred embodiment, implementation of this function is accomplished with software, but it may be implemented with hardware as is shown in FIG. 2 and is easier to understand as shown in the hardware configuration of FIG. 2. The fact that more than one output might be shorted to ground at one time (two at once on the 74LS244 chip for example) is not a problem, as the outputs are only shorted to ground for a brief fraction of a second before the tester figures out which device it is looking at and locates the ground connection at the proper pin.

The output data latch 61 cooperates with OR gates 17, 62 and transistors 56, 58, 60 in a special relational manner, the operation of which should be readily understood by those skilled in the art having reference to FIG. 2 and the following description.

Pin 10 of the socket 5 is always grounded. This correctly accommodates a 20 pin device and has no effect on any pins of 14, 16, or 18 pin devices. To make the ground connection at pin 9 for an 18 pin device, "OR" gate 62 is turned on by a logic level on line 48 of output latch 61, gate 62 turning on transistor 60 and grounding pin 9. Grounding pin 9 has no effect on any pins of a 14 or 16 pin device, but when a 20 pin device is present, pin 9 may be an output. During the brief time that the test is being made for the 18 pin device, this output will be shorted to ground, which is not a problem according to the manufacturers of TTL devices. To make the pin 8 ground connection for a 16 pin device, both "OR" gates 62 and 17 are turned on by a logic level on line 44 of latch 61, gates 17 and 62 turning on transistors 58 and 60. The grounding of pins 8 and 9 has no effect on any pins of a 14 pin device, but might short an output on pin 8 of an 18 pin device or outputs at pin 8 or 9 of a 20 pin device. Although manufacturers do not normally spec their devices for continuous shorting of more than one output at a time, again this condition occurs for such a brief period of time that there is no chance of damaging the device. To make the pin 7 ground connection for a 14 pin device, a logic level is outputted from latch 61 on line 50 which turns on transistor 56 grounding pin 7. Pins 8 and 9 are grounded via transistors 58 and 60 and gates 17 and 62. This could short 1, 2, or 3 outputs to ground on a 16, 18, or 20 pin device, respectively, but as explained above, the brief time period involved prevents damage to the device under test.

The reason for the grounding of additional pins (pins 8 and 9 for a 14 pin device or pin 9 for a 16 pin device) and hence the reason for the gates 17 and 62 (or their equivalent software) is to make sure that no input on a device under test can ever be subjected to a level more negative than the device's ground pin. If an input happens to be pulled even two volts lower than the level at which the device's ground pin is floating, even briefly, damage to the device may result. Care must be taken that either the device's actual ground pin is always pulled down to ground (even when testing for a device with fewer pins) or that none of the input pins on that device are pulled down to ground without the protection of a resistor (52). Gates 17 and 62 guarantee that at least one of these conditions will be met.

A few devices, such as the 74LS90, have power pins at non-standard pin numbers. These devices are accommodated by the tester through the use of an adapter which plugs into the socket 5, and the device under test is then plugged into the adapter. The adapter routes the power from pins 10 and 20 of socket 5 to whichever pins require power on the device to be tested.

Output data latch 59 loads the pins on the device under test by pulling the terminal high or low through a load resistor 52. The signals from latch 59 are fed through resistors 52 to the device under test in socket 5. In the preferred embodiment, 390 ohm resistors were used and found to be an acceptable compromise between input and output load requirements of different families of devices to test. That is, if the pin loaded by latch 59 is an input pin, it is necessary that latch 59 pull the input down to draw out sufficient current to cause the chip to receive a logical 0 input level. Accordingly, the resistor value for resistors 52 must be relatively low in value. On the other hand, when latch 59 serves an output pin, the high level output driving capability requires a relatively high value of resistance. This is especially true for the low power series TTL devices. To use a single resistor to both drive inputs and load outputs, a compromise value is necessary if the tester is to test devices in both low and high power families. Note should be made of the fact that this single compromise value resistor enables the same circuit to function as either an input or as an output. This eliminates the need for switching between separate input and output circuits as the tester experiments while identifying the device under test, and therefore eliminates the extra circuitry required to perform the switching. The same resistor can be used to pull an input either up or down or can be used to load an output either up or down. The ability to load an output either up or down allows the tester to differentiate between standard TTL outputs and open collector outputs. Standard outputs will remain the same whether pulled up or down, while open collector outputs will always drop to ground level when pulled down.

When cost is not of the essence, separate input and output load resistors can be used to provide the optimum current handling capabilities. In the "bench type" tester described in this specification, however, the 390 ohm value appears to be an appropriate compromise load resistor for both inputs and outputs, since "worst case" conditions are rarely imposed on the device under test in a "bench-type" test environment.

Figure 8:
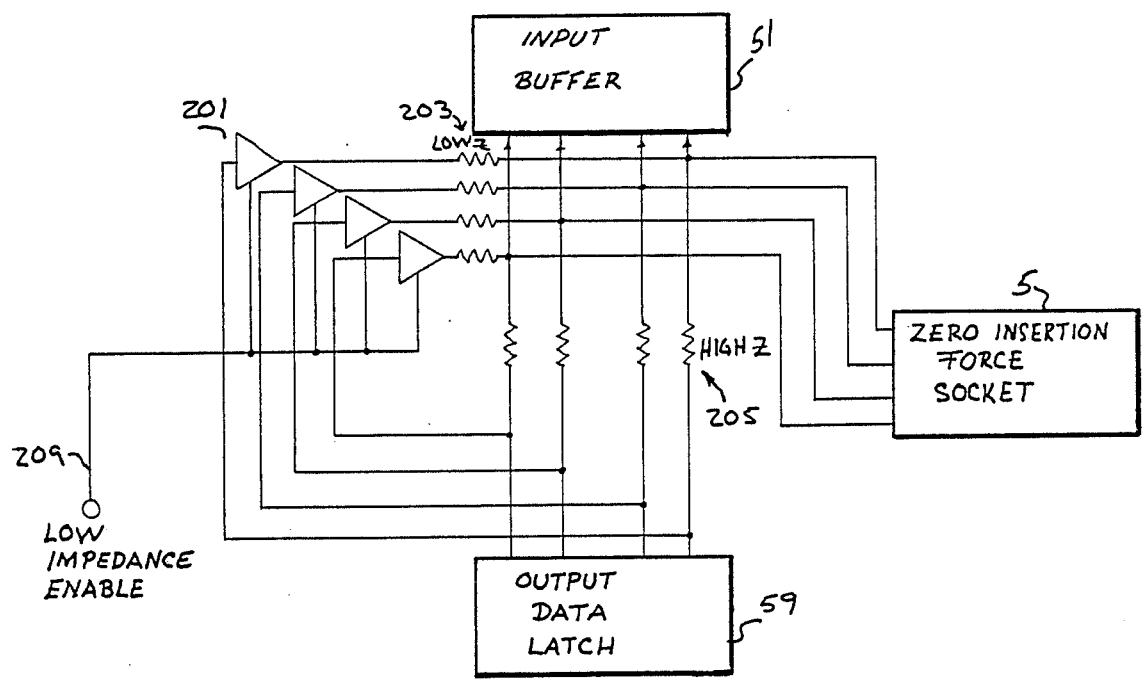
FIG. 8 shows a scheme to avoid the compromise of load resistor values between the output latch and input buffer of FIG. 2.

The arrangement of FIG. 8 could be used to accommodate other families of integrated circuits. If a high "Z" logic family (CMOS 4000 series) were to be tested, the tri-state low impedance buffers 201 would be disabled by line 209, and only the high "Z" resistors 205 would be active. For a low "Z" logic family (7400 TTL series), the eighteen buffers 201 (four are shown) are all enabled, effectively switching in the eighteen low "Z" resistors 203 in parallel with corresponding high "Z" resistors 205.

As illustrated in FIG. 8, all eighteen lines are switched between low and high "Z" simultaneously. However, individual buffers could be switched to load different lines differently at the same time, if desired.

Output data latch 61 serves two functions. Two of its lines are used to load pins 9 and 11 of the device under test. These are necessary only when testing 20-pin devices, of course. Three additional lines are used, as shown, to provide control for the arrangement of gates 17, 62 and transistors 56, 58, 60 which determine where the ground is connected to the device under test. It is important to recall when testing 20-pin devices to keep from inadvertently changing the ground when outputting to pins 9 and 11 of the device under test.

Output data latch 63 functions to load pins 12-19 of the test socket 5 in a manner similar to that described in connection with output data latch 59.

Turning now to the flow charts of FIGS. 3-5, the operation of the circuit of FIG. 2 will now be described with functional description.

Blocks in the chain from 65 to 75 comprise the main program loop. Beginning with power on, control is transferred to block 65. In this block, the microprocessor sets up its stack pointer, enables the interrupts, and may have other housekeeping chores to carry out, depending upon on how the circuit components are implemented. Because the preferred embodiment uses the 8156 chip for its interrupt timer and some I/O ports, such housekeeping chores include setting up the time between interrupts and establishing which of the 8156 ports are inputs and outputs. What is required of these function blocks is well known to those skilled in the art.

Which of the decimal points are on and which are off is information stored in a byte of the RAM memory 35 (FIG. 2). In block 67, both decimal points are turned off by clearing that memory byte.

In block 69, the display is set to "----" which indicates either no device is being tested, or that the device is malfunctioning. The main loop 69–75 circles back to block 69, so that the display will reset to "----" whenever a device is removed from socket 5.

Block 71 sets up a pointer (the 8085's H and L registers are used in the preferred embodiment) which points to the first byte of the first routine in the library of different devices, a "routine" corresponding to a particular device. This library is stored in the ROM 37 (FIG. 2). In a simple and inexpensive "bench type" tester, it would not be unreasonable to be able to store 200 to 300 routines in the library. This would correspond to a capability of testing 200 to 300 different chip types.

In block 73, the main subroutine is called. This subroutine, which will be described in greater detail later, systematically runs through each chip type in its library until it either finds a match for the chip under test or reaches the end of the library. If it reaches the end of the library, it will return (block 93). If it finds a match, then it will keep running that test rapidly and indefinitely until it fails, either by the chip "glitching" or by the chip being removed from socket 5, at which time the subroutine continues until it reaches the end of the library and then returns.

In block 75, the "glitch" counter is incremented and displayed. A pair of the decimal points of the LED array 13 are used to display this count in binary format. This display is useful to determine if a chip fails intermittently. The failure may be of such short duration that the "----" display could be missed. But the count in the "glitch" counter 75 will change state each time there is an error detected, and will stay in the new state indicating that an error has occurred. As previously noted, it would be a simple matter to add additional components to the tester to have a digital display of the "glitch" count to as many as significant figures as would be appropriate under the circumstances. In the preferred embodiment, only two decimal points, providing a count of three possible errors (states 1, 2, 3) before resetting to their original states is recommended.

The interrupt routine is described in blocks 77-83.

When the timer 33 (FIG. 2) sends an interrupt (block 77) to the microprocessor 41, control is transferred, and the first operation which is carried out is the saving of the contents of the microprocessor's registers is as normal in an interrupt routine.

In block 79, the digit counter is incremented. The digit counter is a byte in RAM 35 whose contents are altered with each interrupt. The count loops in the following fashion: 1, 2, 3, 4, 5, then back to 1, repeatedly. Counts 1-4 correspond to the four digits on the LED display 13, and the fifth count corresponds to the decimal points. This count determines which of the five indicia will be illuminated on each interrupt.

For block 81, the contents of one of five other RAM 35 locations are fetched. Which one depends upon the status of the count in block 79 described above. These five locations also correspond to the four digits and the decimal points. The decimal point location was mentioned above in connection with the description of block 67. If a digit (as opposed to the decimal points) is to be displayed at the current time, it is converted to an image of the seven-segment number. For example, if the number "8" is to be displayed, all seven of the segments must be turned on. This means that the number "8" is converted to the binary number "1111111". A blank space would have no segments turned on and would be translated to the binary number "0000000".

Before altering the segment driver 45, all of the digits in latch 57 must be turned off. Otherwise unwanted segments will dimly light on the wrong digit. After turning all digits off, the segment driver 45 can be altered and subsequently the new digit can be turned on.

Finally, in block 83 all of the registers are restored back to their condition before the interrupt, and control is returned to the testing program.

The main testing subroutine will now be described.

Figure 3:
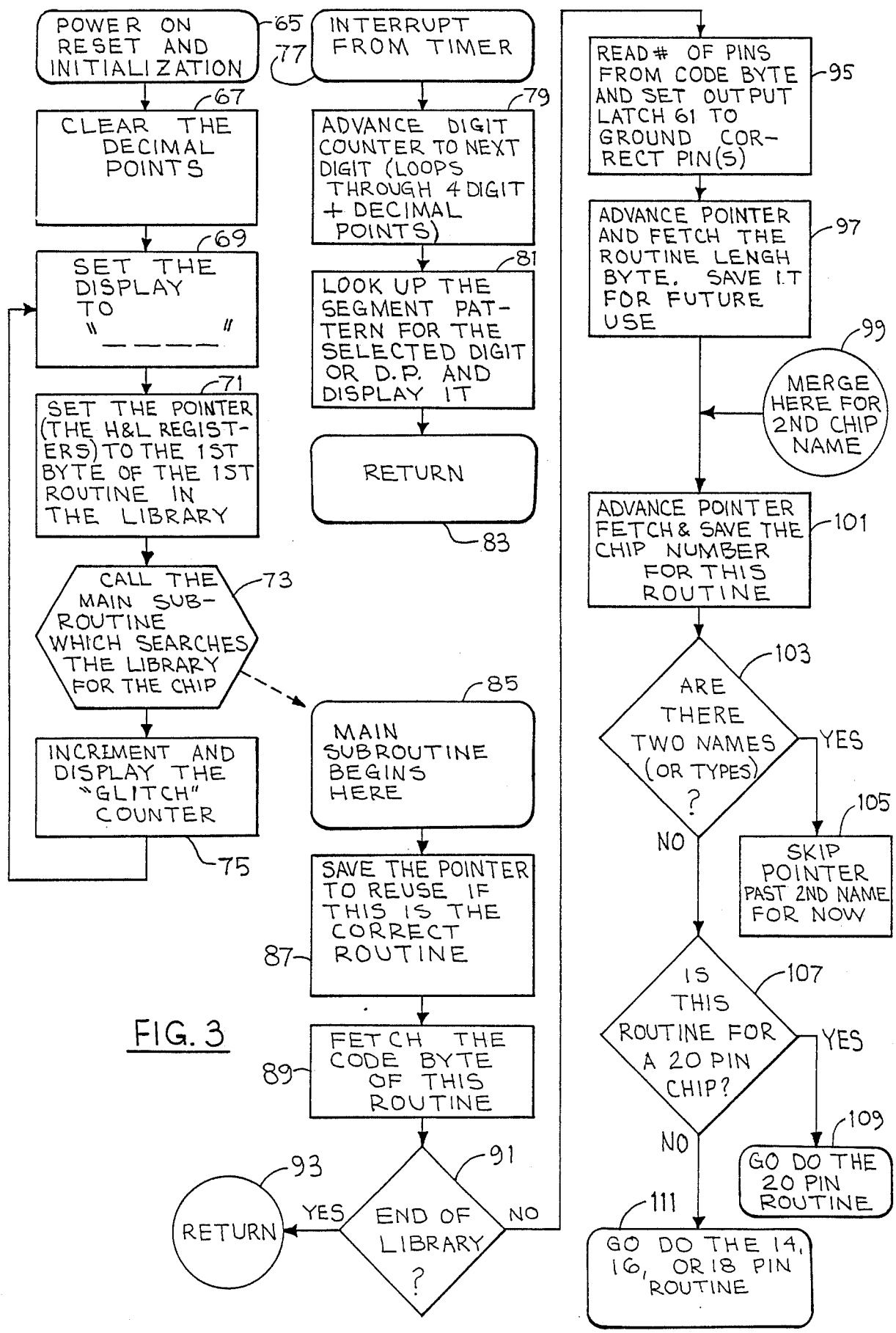
FIG. 3 is a first flow chart showing the power on, reset, and initialization flow diagram, as well as the main sub-routine diagram.

The remainder of the flow chart in FIG. 3 describes the subroutine which searches the library for a test routine that matches the device in socket 5 beginning with block 85.

In block 87, the pointer (which was originated in block 71) is saved as each test routine in the library is run against the device under test. This is done in order that the microprocessor 41 will know where to come back to if this routine is to be run again, instead of going on to the next test routine.

In block 89, the "code byte" 183 and 195 (FIG. 6) is fetched and saved for future reference. The code byte is the first byte in each device test routine and it tells the microprocessor 41 some information about the device assumed to be in the test socket at the time. If the code byte is equal to FFh, then the end of the library has been reached (block 91) and control is returned (block 93) to the main loop 69–75. The code byte can be purposely set to not indicate the end of the library by, for example, setting one of the spare bits to always be low. This will be clarified later in connection with FIG. 6.

Assuming the library is not at its end, the code byte is examined in block 95 to see how many pins the current routine expects the device to have (see code byte format 195 in FIG. 6). This information is used to select the ground pin through the cooperation between the output data latch 61, and the gates and transistors coupled to pins 7–9 of socket 5 described earlier.

Next, in block 97, the pointer is advanced to the next byte in the library which is the length byte (refer to item 185 in FIG. 6). This byte tells the microprocessor 41 how long a particular test routine, or part of a routine, is in order that the microprocessor 41 will know when it has finished processing the routine. To save memory, this length byte is only one byte long, even though the memory pointer is two bytes long. The length byte is equal to what the least significant byte of the pointer will be when the routine (or part thereof) is finished. This means that the routines can only be about 256 bytes long, but this limitation is no problem for most devices. Test routines should be kept short in any event in order to fit as many possible routines into the available ROM space.

Next, in block 101, the pointer is advanced again, and the device number or name 187 (FIG. 6) is fetched and saved. If the present test routine matches the device under test, then the device number or name 187 is what will appear on the display 13. The device number is shortened somewhat so that it will fit on the four-digit display. For example, 74LS00 is simply displayed at "00". This method of abbreviation runs into some trouble with chips such as the 7486, 74LS86, and the 74L86 where the "L" has different pin configurations than the standard or the "LS" type. Here, the "L" is identified as "L86", and both the standard and the "LS" are identified as "−86". The "−" serves as a warning that although this particular device is of the standard configuration, other families of the same number have different pinouts.

The code byte is examined again in block 103 to see how many device "names" (or "numbers" or "types") apply to the present test routine. Bit 3 of the code byte 195 indicates if there is only one or if there are two "names". Some devices are functionally the same, except that one has normal TTL outputs and the other has open collector outputs. The 74LS04 and the 74LS05 are an example of such a pair. In these cases, the same test routine can be made to service both device types, but both device types are identified in the test routine at 187 and 189 (FIG. 6). If two are present, the second must be skipped over for the time being (block 105) but will be returned to (block 99) if the test for the first chip fails. The first chip is always the standard chip type, and the second is the open collector version. The open collector flag is initially cleared.

Because it takes only two bytes of information to set the status of a 14-, 16-, or 18-pin chip, but it takes three bytes for a 20-pin chip, the 20-pin chips are handled with a different test routine than the others (blocks 107, 109, and 111). However, insofar as the flow chart is concerned, the routines are the same, so that both begin at block 113.

With block 115, the pointer is advanced again, and a "MASK" (191) is loaded, the "MASK" identifying which of the pins on a chip are outputs and which are inputs. Although the power connections are illustrated in the test routine mask documentation, they are not part of the actual mask. The mask thus identifies which pins are the outputs and which pins should therefore resist loading changes. An output of "0" should remain "0" whether a resistor is trying to pull it up or down, but inputs must follow the high or low levels applied.

Next, in block 117, the pointer is advanced to one of a number of test patterns 193. First, the device is loaded with its outputs pulled high. The I/O mask is used to identify which pins are to be pulled up (block 48). Then, in block 121, the modified pattern is outputted to latches 59 and 63 and is also outputted to latch 61 if the device under test is a 20-pin device.

Because some devices, such as 74LS162 counter with synchronous clear, will not always produce a predictable pattern when the first test pattern is applied, a setup branch 123 is provided. If bit 4 of the code byte 195 is set to a "1", then the testing blocks 143–163 are bypassed and the pointer is repeatedly advanced, block 125, and new data patterns are presented to the device, 117–121, 123, and 125, until the end specified by the length byte 185 is reached, block 127. When this occurs, block 129, the setup mode flag bit of the code byte 195 is cleared, block 131, and a new length byte is loaded. Subsequently, control returns to block 117 and continues from there.

After outputting a pattern to the device under test, the normal sequence 143 is used to check to see if the device did what it was expected to do. Data from the chip is inputted through buffers 51 and 55 (and also through buffer 53 if a 20-pin chip is under test) and compared with the original test pattern which contains both inputs and outputs. If the pattern fails to match, then control is transferred to the error routine 147.

If there is a match, block 149, then the outputs are next pulled low. Depending upon whether a standard TTL or an open collector device is expected, block 151 (bit 2 of code byte 195), one of two results is looked for: either the pattern is supposed to match (blocks 153 and 155) for a standard device, or all of the outputs are supposed to be low (blocks 159 and 161) for an open collector device. If the expected result is not obtained, control is transferred to the error routine 157 or 163.

If the expected result is obtained, then the pointer is advanced, (block 125) to the next test pattern, and the test loops (117–125, 143–155, or 143–161, and 125) until the LSB of the pointer finally matches the length byte 127, and control drops through block 129 (because the setup bit was cleared earlier if it was ever set) to block 133.

Block 133 checks the code byte 195 to see if this routine has a second I/O mask that must also be tested For example, tri-state outputs are treated as outputs when enabled and as dummy inputs when disabled. If a second mask is required, bit 5 of code byte 195 is reset, block 135, a new length byte for the next series of test patterns is loaded, control is transferred back to block 115, and each of the subsequent test patterns is run until the LSB of the pointer matches the new length byte 127.

If the multi-I/O mask flag was not set or if it has been cleared and the set of test patterns run which used the second I/O mask, then control drops through to block 137. At this point, the chip has been identified, and it is also known to be a working device because the method of identification comprised running a set of patterns which tested all of its functions. The device name or number is then moved to the location in RAM (described in connection with block 77) where the interrupt routine can find it and display it.

Finally, the old pointer (saved in block 87) is restored, and control is transferred, block 141, back to block 85. The same test is then rapidly repeated until it fails once. At that point, the microprocessor 41 will resume looping through the library until it again finds a match.

The error routine will now be described.

When a device fails to deliver an expected result, control is transferred to the error routine beginning at block 165. First, the code byte 195 is interrogated to determine if there are two different chip types (normal and open collector) to which the routine is to be applied, block 167. If there are, the pointer is reset (block 169) back to the beginning of the test routine, the "two types of chips" flag is cleared, and the "open collector" flag is set, block 171. Next, in block 173, the pointer is advanced to the optional second name, block 189, which will be present since there are two device types associated with this test routine, and that name, which corresponds to the open collector device, replaces the first one. Then, in block 175, the routine is rerun beginning with block 113, but this time an open collector device is expected.

If there were not two chip names, or if there were two chip names but an error was detected in the open collector routine as well, then the "two types" flag will be cleared and control drops through to block 177 where the pointer is repeatedly advanced until its LSB matches the length byte. Note should be made of the fact that this is not exactly the same as setting the LSB of the pointer to the length byte, because the MSB may need to be advanced as well.

Next, a check is made of the code byte 195, block 179, to see if it is the end of the chip routine or if the length byte merely points to the end of the test patterns for the first mask. It is understood that here the length byte does not point to the end of a setup routine, because setup routines never detect errors.

If the process is merely at the end of the first mask's patterns, then, block 181, the new length byte is fetched and the pointer is again repeatedly advanced until its LSB matches the new length byte. At this point, the pointer is set to the code byte of the next device test routine and control is passed back, block 183, to block 85 of the flow chart.

FIG. 6 shows a typical arrangement of data that would, for example, be displayed on a printout of the library of test pattern sequences for the microprocessor's control program. Shown in FIG. 6 in particular is the code byte 183 which is shown in exploded view at 195 showing the bits 0–7 and the information each bit conveys. Also shown for an understanding of the number of bytes in each part of the instructions set, are length byte 185, chip name or number 187, optional second name 189, I/O mask 191, test patterns 193, and a location for the code byte for the next device's test pattern sequence or "FFh" if the "end of library" is to be designated.

The length byte 185 contains the LSB of what address the pointer will point to when it is finished with this routine or some part of it corresponding to a set up routine which precedes the test or a first I/O mask test routine where a second I/O mask will be used before the test is complete.

If the setup flag bit is set, there will be an additional "length byte" among the test patterns.

If the "multi-I/O mask" bit is set, there will be an additional "length byte" and an additional I/O mask among the test patterns as represented in FIG. 7.

Figure 4:
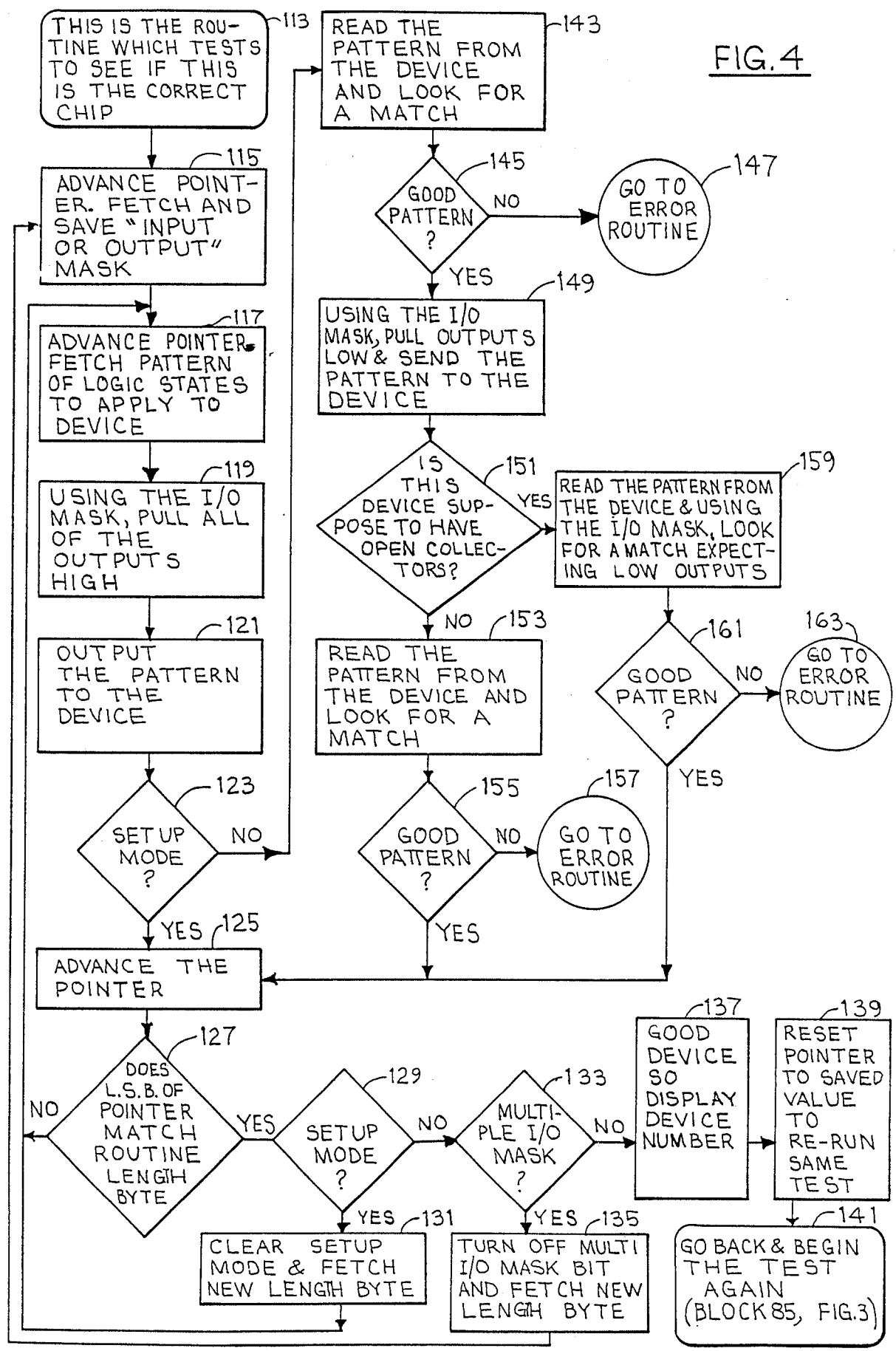
FIG. 4 is a second flow chart diagramming the routine which tests to see if the chip under test is the correct chip according to the input/output pattern generated.

Tables 1–4 which follow show a sample listing for a library of sequences of test patterns which is to be used with the flow charts of FIGS. 3–5. In Tables 1–4, the library listing is supplemented by annotations and diagrams where appropriate to enhance the understanding of the listing sequence. It is suggested that, especially with the annotations and diagrams on the listing of the library and with the flow charts, one skilled in the art would have no difficulty in reproducing the invention in the best mode known to applicant for the intended field of use for the invention. The clear correspondence between the listing in Tables 1–4 and FIGS. 6 and 7 are self-evident, and it should be appreciated that the lists shown in the tables are a partial listing for only a few chip types.

For a clearer understanding of the Tables and FIGS. 6 and 7, the following is a summary of the significance of the data bytes in the listings of Tables 1–4.

```
EACH DEVICE TYPE IS REPRESENTED BY A SERIES OF BYTES:

1)  A CODE BYTE WHICH IDENTIFIES:
    A) GROUND CONNECTIONS
    B) THE EXISTENCE OF A POSSIBLE SETUP MODE
    C) THE EXISTENCE OF A POSSIBLE SECOND I/O MASK
    D) THE EXISTENCE OF A POSSIBLE SECOND DEVICE NAME

2)  A LENGH BYTE WHICH IDENTIFIES THE END OF A
    PARTICULAR GROUP OF TEST PATTERNS

3)  TWO BYTES OF DEVICE NAME FORMATTED AS FOUR
    "HEX" DIGITS.  HEX CODES 0-9 REPRESENT DECIMAL
    NUMBERS AND HEX CODES A-F ARE DESIGNATED AS
    FOLLOWS:
              A)  "A"            D)  "-"
              B)  BLANK SPACE    E)  "L"
              C)  "C"            F)  "H"

THESE CHARACTERS CAN ALL BE REPRESENTED IN
    SEVEN-SEGMENT FORMAT.
```

3B) IF THE CODE BYTE CALLS FOR A SECOND DEVICE NAME
    THEN THERE WILL BE TWO MORE BYTES OF DEVICE NAME
    HERE

4)  A TWO OR THREE BYTE INPUT/OUTPUT MASK (TWO BYTES
    FOR 14-18 PIN DEVICES AND THREE BYTES FOR 20 PIN
    DEVICES) THAT IDENTIFIES WHICH OF THE DEVICES
    PINS ARE TO BE REGARDED AS INPUTS AND WHICH AS
    OUTPUTS. THE MASK IS FORMATTED AS FOLLOWS:

```
              ------- M.S.B.------
    + 5 VOLTS 7  6  5  4  3  2  1  0  X 20 19 18 17 16 15 14 13 12 11  < SOCKET PIN #.
              ------------------------  ---
              !                       !  !
              )       16 PIN          !  !< 20 PIN DEVICE
              !.      DEVICE          !  !
              ------------------------  ---
              1  2  3  4  5  6  7  8  9  10

7  6  5  4  3  2  1  0  X  GROUND
              ------- L.S.B.------
```

A BINARY "1" INDICATES AN OUTPUT, A "0" AN INPUT.

BECAUSE PINS 10 AND 20 ARE ALWAYS CONNECTED TO
    GROUND AND +5V RESPECTIVELY, THEY DO NOT NEED TO
    BE IDENTIFIED IN THE MASK. WHEN OTHER PINS ARE
    TO BE USED AS GROUNDS OR POWER CONNECTIONS, THEY
    CAN BE REGARDED AS EITHER INPUTS OR OUTPUTS BY
    THE MASK.

FOR 18 PIN DEVICES, PIN 9 IS USED AS A
    GROUND AND DOES NOT NEED MASK IDENTIFICATION.
    20 PIN DEVICES REQUIRE A THIRD BYTE OF MASK FOR
    IDENTIFYING PINS 9 AND 11 AS FOLLOWS:

BYTE 3:    7  6  5  4  3  2  1  0

PIN:       9  X  X  X  X  X  X  11

5)  IF THE CODE BYTE CALLS FOR A SETUP MODE, THERE
    WILL BE A SERIES OF SETUP PATTERNS EACH OF TWO
    BYTES LENGH FOR 14-18 PIN CHIPS OR OF THREE
    BYTES LENGH FOR A 20 PIN CHIP.

THE END OF THIS GROUP OF INSTRUCTIONS IS IDENTIFIED
    BY THE LENGH BYTE ABOVE.

5B) IF THE CODE BYTE CALLS FOR A SETUP MODE, THERE
    WILL BE A LENGH BYTE HERE TO IDENTIFY THE END
    OF THE NEXT GROUP OF PATTERNS

6)  A SEQUENCE OF TEST PATTERNS COMPRISING BOTH:
    1) INPUTS TO PRESENT TO EACH INPUT PIN AND
    2) EXPECTED OUTPUTS TO BE SEEN AT EACH OUTPUT PIN.

THE SAME FORMAT IS USED HERE AS FOR THE MASK BYTES.
    PINS WHICH ARE MASK IDENTIFIED AS INPUTS WILL BE LOADED
    ACCORDING TO CORRESPONDING BITS OF THESE PATTERNS.
    PINS WHICH ARE MASK IDENTIFIED AS OUTPUTS ARE
    LOADED AS NEEDED TO TEST THE TYPE OF OUTPUT DRIVER
    AND ARE TESTED FOR CORRECT OPERATION ACCORDING TO
    THE CORRESPONDING BITS OF THESE PATTERNS.

A BINARY "1" CALLS FOR A HIGH LOGIC STATE, A "0" FOR
    A LOW.

AS WITH THE MASK, EACH TEST PATTERN TAKES TWO BYTES
    FOR A 14-18 PIN DEVICE AND THREE FOR A 20.

7) IF CALLED FOR BY THE ALTERNATE MASK BIT OF THE CODE
   BYTE, THERE WILL BE HERE:

A) AN ADDITIONAL LENGH BYTE
   B) AN ADDITIONAL I/O MASK
   C) AN ADDITIONAL SEQUENCE OF TEST PATTERNS

```
******************************************************************
              LIBRARY OF DEVICE TEST ROUTINES:

EQUATES

PIN14     EQU 03H          ;14 PIN DEVICE
 PIN16     EQU 02H          ;16 PIN DEVICE
 PIN18     EQU 01H          ;18 PIN DEVICE
 PIN20     EQU 00H          ;20 PIN DEVICE

OC        EQU 04H          ;OPEN COLLECTOR
 NAMES     EQU 08H          ;MULTIPLE DEVICE NAMES
 SETUP     EQU 10H          ;SETUP MODE REQUIRED
 MASKS     EQU 20H          ;A SECOND I/O MASK REQ'D

PIN9      EQU 80H          ;PIN 9 OF A 20 PIN DEVICE
 PIN11     EQU 01H          ;PIN 11 OF A 20 PIN DEVICE

LAST      EQU 0FFH         ;END OF LIBRARY
```

TABLE 1

```
;-----------------------------------------------------------------
;
;    DEVICE TYPE 74LS00/03    (ALSO 7400/5400/L/S/LS/H ETC.)
;
0000 0B           BYTE PIN14+NAMES   ;CODE BYTE
0001 10           BYTE END00         ;LENGH BYTE
0002 B00B         WORD 0B00BH        ;FIRST NAME 74LS00 " 00 "
0004 B03B         WORD 0B03BH        ;2ND NAME   74LS03 " 03 "
     ;
     ; I/O MASK:  + I I 0  I I 0  X X        00100100
     ;              I I 0  I I 0  G X        00100100
0006 2427         WORD 2427H
     ;
     ; TEST PATTERNS:  10 1  01 1  00        10101100
     ;                 11 0  00 1  00        11000100
0008 ACC4         WORD 0ACC4H
     ;
     ;                 11 0  10 1  00        11010100
     ;                 00 1  01 1  00        00101100
000A D42C         WORD 0D42CH
     ;
     ;                 00 1  11 0  00        00111000
     ;                 01 1  10 1  00        01110100
000C 3874         WORD 3874H
     ;
     ;                 01 1  00 1  00        01100100
     ;                 10 1  11 0  00        10111000
000E 64B8         WORD 64B8H
     ;
     END00   EQU *          ;END OF 74LS00 TEST PATTERN SEQUENCE
     ;
;-----------------------------------------------------------------
     ;
     ; DEVICE TYPE  74LS01 ETC.  (O.C. ONLY)
     ;
0010 07           BYTE PIN14+OC      ;CODE
0011 1E           BYTE END01         ;LENGH
0012 E01B         WORD 0E01BH        ;NAME 74LS01 "L01 "
     ;
     ; I/O MASK  + 0 I I  0 I I  X X        10010000
     ;             0 I I  0 I I  G X        10010000
0014 9090         WORD 9090H
     ;
     ; TEST PATTERNS:  1 10  1 01  00       11010100
     ;                 0 11  1 00  00       01110000
```

```
0016 D470         WORD 0D470H
          ;
          ;                   0 11  1 10  00       01111000
          ;                   1 00  1 01  00       10010100
0018 7894         WORD 7894H
          ;
          ;                   1 00  0 11  00       10001100
          ;                   1 01  1 10  00       10111000
001A 8CB8         WORD 8CB8H
          ;
          ;                   1 01  1 00  00       10110000
          ;                   1 10  0 11  00       11001100
001C B0CC         WORD 0B0CCH
          ;
          END01   EQU *       ;END OF 74LS01 TEST PATTERN SEQUENCE
          ;
```

TABLE 2

```
          ;------------------------------------------------------------
          ;
          ;   DEVICE TYPE  74LS75  (NON-STANDARD POWER CONNECTION)
          ;
08E4 00           BYTE PIN20      ;ACTUALLY 16 PIN DEVICE
08E5 FA           BYTE END75      ;POINTS TO END
08E6 B75B         WORD 0B75BH     ;NAME 74LS75  " 75 "
          ;
          ;   I/O MASK  (+)  0  0 0   I  -  0 0 0  X    11101111 0
          ;                   X  0 I I I  +  I 0 (-)    01000100 1
08E8 EF44         WORD 0EF44H
08EA 80           BYTE PIN9       ;(BYTE 3)
          ;
          ;    01010101 0
          ;    01011101 0
08EB 555D         WORD 555DH
08ED 00           BYTE 00H
          ;
          ;    01000010 0
          ;    01011110 1
08EE 425E         WORD 425EH
08F0 80           BYTE PIN9
          ;
          ;    01000010 0
          ;    01100110 1
08F1 4266         WORD 4266H
08F3 80           BYTE PIN9
          ;
          ;    10110010 0
          ;    00100101 1
08F4 B225         WORD 0B225H
08F6 80           BYTE PIN9
          ;
          ;    01010101 0
          ;    01011101 0
08F7 555D         WORD 555DH
08F9 00           BYTE 00H
          ;
          END75 EQU *           ;END OF 74LS75 DEVICE ROUTINE
          ;
```

TABLE 3

```
          ;------------------------------------------------------------
          ;
          ;   DEVICE TYPE  74LS377  (20 PIN DEVICE, SETUP REQUIRED)
          ;
0951 10           BYTE PIN20+SETUP  ;CODE BYTE
0952 5B           BYTE SET377       ;MARKS THE END OF THE SETUP ROUTINE
0953 B377         WORD 0B377H       ;NAME 74LS377 " 377"
          ;
          ;   I/O MASK  +  O I  I O  O I  I O  I     10011001 0 <PIN 11
          ;              I O I  I O  O I  I O  G     01001100 1 <PIN 9
0955 994C         WORD 994CH
0957 80           BYTE PIN9
          ;
          ;   SETUP PATTERN: 00 00 00 00 0
          ;                   0 00 00 00 00
0959 0000         WORD 0000H
095A 00           BYTE 00H
```

```
              ;
              SET377  EQU  *         ;END OF PATTERNS FOR SETUP
              ;
              ;  - - - - - - - - - - - - - - - - - - - - - - - - -
              ;
095B 77             BYTE END377      ;MARKS THE END OF THE DEVICE ROUTINE
              ;
              ;  TEST PATTERNS:  00 00 00 00  1
              ;                   0 00 00 00 00
095C 0000           WORD 0000H
095E 01             BYTE PIN11
              ;                  01 10 01 10  0
              ;                   0 01 10 01 10
095F 6633           WORD 6633H
0961 00             BYTE 00H
              ;                  11 11 11 11  1
              ;                   0 11 11 11 11
0962 FF7F           WORD 0FF7FH
0964 81             BYTE PIN9+PIN11
              ;                  10 11 10 11  0
              ;                   0 11 01 11 01
0965 BB6E           WORD 0BB6EH
0967 80             BYTE PIN9
              ;                  00 11 00 11  1
              ;                   0 11 00 11 00
0968 3366           WORD 3366H
096A 01             BYTE PIN11
              ;                  01 01 01 01  0
              ;                   1 10 10 10 10
096B 55D5           WORD 55D5H
096D 00             BYTE 00H
              ;                  01 01 01 01  1    (DISABLED CLOCK)
              ;                   1 10 10 10 10
096E 55D5           WORD 55D5H
0970 01             BYTE PIN11
              ;                  01 01 01 01  0
              ;                   0 10 10 10 10
0971 5555           WORD 5555H
0973 00             BYTE 00H
              ;                  11 00 11 00  1
              ;                   0 00 11 00 11
0974 CC19           WORD 0CC19H
0976 81             BYTE PIN9+PIN11
              ;
              END377  EQU  *    ;END OF 74LS377 DEVICE ROUTINE
              ;------------------------------------------------------
              ;
              ;    DEVICE TYPE  74LS245  (20 PIN DEVICE WITH TWO I/O MASKS)
              ;
0A25 20             BYTE PIN20+MASKS  ;CODE BYTE
0A26 35             BYTE MSK245       ;MARKS THE END OF THE FIRST MASK
0A27 B245           WORD 0B245H       ;NAME 74LS245  " 245"
              ;
              ; I/O MASK   + L 0 0 0 0 0 0 0 0     01111111  1 <PIN 11
              ;             H I I I I I I I I G    00000000  0 <PIN 9
0A29 7F00           WORD 7F00H
0A2B 01             BYTE PIN11        ;PIN 11=H  PIN 9=L
              ;
              ; TEST PATTERNS FOR FIRST I/O MASK:
              ;
              ;             01010101 0
              ;             11010101 0
0A2C 55D5           WORD 55D5H
0A2E 00             BYTE 00H          ;NEITHER PIN 9 NOR PIN 11
              ;
              ;             00101010 1
              ;             10101010 1
0A2F 2AAA           WORD 2AAAH
0A31 81             BYTE PIN9+PIN11
              ;
              ;             01111111 1
              ;             11111111 1
0A32 7FFF           WORD 7FFFH
0A34 81             BYTE PIN9+PIN11
              ;
              MSK245  EQU  *       ;END OF PATTERNS FOR FIRST MASK
              ;
              ;  - - - - - - - - - - - - - - - - - - - - - - - - -
              ;
```

TABLE 4

```
0A35  42              BYTE  END245        ;MARKS THE END OF THE DEVICE ROUTINE
                ;
                ;  2ND MASK   +  L  I I I I I I I I       00000000  0  <PIN 11
                ;                 L  0 0 0 0 0 0 0 0  G   01111111  1  <PIN 9
0A36  007F            WORD  007FH
0A38  80              BYTE  PIN 9         ;PIN 11=L  PIN 9=H
                ;
                ;  TEST PATTERNS FOR SECOND I/O MASK:
                ;
                ;                01010101 0
                ;                01010101 0
0A39  5555            WORD  5555H
0A3B  00              BYTE  00H
                ;
                ;                00101010 1
                ;                00101010 1
0A3C  2A2A            WORD  2A2AH
0A3E  81              BYTE  PIN9+PIN11
                ;
                ;                00000000 0
                ;                00000000 0
0A3F  0000            WORD  0000H
0A41  00              BYTE  00H
                ;
                      END245  EQU *     ;END OF 74LS245 DEVICE TEST ROUTINE
                ;
                ;---------------------------------------------------------------
                ;
                ;       END OF LIBRARY OF DEVICE TEST ROUTINES:
                ;
0A42  FF              BYTE  LAST
                      END
```

Of special note in Table 1 is the possibility that the chip function shown (Quad 2-input NAND gate) may be open collector gates, or the gates may have standard or "totem-pole" TTL outputs, as explained in detail earlier. The 74LS00 has standard TTL outputs and block 153 of FIG. 4 is operative. The 74LS03 is an open collector version and block 159 of FIG. 4 is operative. The "MASK" identifies inputs (I), outputs (O), and "don't cares" (X). The plus 5V power terminal (+) and the ground terminal (G), although not actually identified in the mask itself, are included in the documentation of the mask to assist in visualizing how the mask overlays the device.

With further reference to Table 1, the first I/O "TEST PATTERN" for the 74LS00/03 (word OACC4H) shows the logical signal pattern for one possible test condition for the chip. Words OD42CH, 3874H, and 64B8H complete all the possibilities for all inputs. That is, the first two logic levels noted are for application to one of the four gates in the Quad-2 package. By following the list downwardly, it can be seen that all possible input combinations are tried; 10, 11, 00, and 01. The third logic level (horizontally) represents the output of the same gate and, of course, should be a logical 1 when either input is a logical 0, and should be a logical 0 only when both inputs are logical 1's. The same analysis can be made of the other three gates to show that the tester exercises all four gates of the chip in all possible operative conditions.

The 74LS01 chip has only one name, since it is available in only the open collector version. It is a Quad 2-input NAND gate, but with a different pin layout (pinout) than that of the 74LS03. Here, the first logical level (horizontally) represents the output of one of the gates and the next two represent its inputs. As can be seen, the same four patterns for input levels is applied to each input pair (10, 11, 00, and 01).

Table 2 shows an example of a chip (4-bit bistable latch) which has non-standard power connections. It is with this type of device that an adapter, switching arrangement, or electronic switching is used to route the +5 Volts to pin 5 and ground to pin 12. Although it is a 16-pin device, it is tested as if it were a 20-pin device due to the fact that none of the pins 7, 8, or 9 may be grounded as would be the case for a normal 14, 16, or 18 pin device.

Because some chips attain unpredictable logic states without preset conditions being met (like the 74LS377 octal 'D-type' Flip Flop with enable), an initial setup test pattern is first applied. Referring to Table 3, the initial setup is accomplished by applying a logical "0" to all pins, followed by applying the normal test pattern sequence.

Finally, Table 4 shows an example of a 20-pin chip (74LS245) exhibiting the need for two 3-byte I/O masks and a series of 3-byte test patterns. The two masks are required due to the fact that exercising certain pins of the device results in an entirely different function for the chip than when other pins are exercised. At the end of this listing, an "END OF LIBRARY" code is present (discussed earlier).

As stated earlier, even an inexpensive unit that has a physical size illustrated in FIG. 1 and a selling price in the vicinity of $200.00 would have the ability to test between 200 and 300 different chip types.

A typical clock rate for the tester would be in the vicinity of 2 MHz. A typical display refreshing rate may be in the order of 1 KHz stepping through the digits. The aforementioned time for a totem-pole output to be temporarily grounded during a test is about 100 milliseconds or less. As discussed earlier, such a short time for temporarily grounding an outprt will not be damaging to the chip.

From the foregoing, it can be readily realized that this invention can assume various embodiments. Thus, it is to be understood that the invention is not limited to the specific embodiments described herein, but is to be limited only by the appended claims.

We claim:

1. A chip tester for testing a variety of microelectronic chip types in a multiple-pin test socket, each chip type having input terminals, output terminals, a power supply terminal, and a ground terminal, said tester adapted for testing at least two chip family types in said multiple-pin test socket, a first family type having its ground terminal at a first pin position of said test socket, and a second type having its ground terminal at a second pin position of said test socket different from said first pin position, said tester comprising:

means for applying power to said power supply terminal of a chip under test;

means for applying ground to said ground terminal of said chip under test;

drive means for applying first and second sequences of signal patterns to said input and output terminals of a chip under test for respective first and second chip family types;

means for monitoring the signal pattern on said input and output terminals;

means for indicating, for each said signal pattern applied, whether or not chip under test is operational responsive to the existence or not, respectively, of a predetermined relationship between the signal pattern on said input and ouput terminals and the signal pattern established by said drive means;

means for repeatedly and continuously applying only the signal pattern from said sequence of signal patterns that produced said predetermined relationship;

said means for applying ground to said ground terminal of said chip under test including:

means for applying ground potential to said first pin position when applying a sequence of said signal patterns, corresponding to said first chip family type, to said chip under test; and means for applying ground potential to both said first and second pin position when applying a sequence of said signal patterns, corresponding to second chip family type, to said chip under test.

2. The chip tester as claimed in claim 1, wherein:

said chip family types include, and said test socket is adapted to receive, at least two of the chip types consisting of 14-pin, 16-pin, 18-pin, and 20-pin chip types;

said sequence of signal patterns includes signal pattern sequences for corresponding ones of said 14-pin, 16-pin, 18-pin, and 20-pin chip types; and said means for applying ground to said ground terminal includes means for automatically applying ground to pins 7 through 10 when a 14-pin chip test pattern is applied, to pins 8 through 10 when a 16-pin chip test pattern is applied, to pins 9 and 10 when an 18-pin chip test pattern is applied, and to pin 10 when a 20-pin chip test pattern is applied.

3. A chip tester for testing a variety of microelectronic chip types in a multiple-pin test socket, each chip type having input terminals, output terminals, a power supply terminal, and a ground terminal, said tester adapted for testing at least two chip family types in said multiple-pin test socket, a first family type having its ground terminal at a first pin position of said test socket, and a second type having its ground terminal at a second pin position of said test socket different from said first pin position, said tester comprising:

means for applying power to said power supply terminal of a chip under test;

means for applying ground to said ground terminal of said chip under test;

drive means for applying first and second sequences of signal patterns to said input and output terminals of a chip under test for respective first and second chip family types;

said means for applying ground comprising means for applying ground to said first pin position during the application of said sequence of signal patterns relating to said first chip family type, and for applying ground simultaneously to both said first and second pin positions during the application of said sequences of signal patterns relating to said second chip family type;

means for monitoring the signal pattern on said input and output terminals; and means for indicating, for each said signal pattern applied, whether or not the chip under test is operational responsive to the existence or not, respectively, of a predetermined relationship between the signal pattern on said input and output terminals and the signal pattern established by said drive means.

* * * * *